(12) United States Patent
Van Herpen et al.

(10) Patent No.: US 7,372,049 B2
(45) Date of Patent: May 13, 2008

(54) LITHOGRAPHIC APPARATUS INCLUDING A CLEANING DEVICE AND METHOD FOR CLEANING AN OPTICAL ELEMENT

(75) Inventors: Maarten Marinus Johannes Wilhelmus Van Herpen, Heesch (NL); Derk Jan Wilfred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 124 days.

(21) Appl. No.: 11/292,312

(22) Filed: Dec. 2, 2005

(65) Prior Publication Data

US 2007/0125964 A1 Jun. 7, 2007

(51) Int. Cl.
*A61N 5/00* (2006.01)
*G21G 5/00* (2006.01)

(52) U.S. Cl. .............. 250/492.2; 250/504 R; 250/491.1; 250/492.22; 250/492.3; 250/492.23; 355/75; 355/72; 355/30; 355/53; 355/71; 134/1; 134/1.1; 134/10; 134/21; 118/620; 438/798; 378/119

(58) Field of Classification Search ............ 250/492.2, 250/504 R, 491.1, 492.3, 492.22, 492.23; 438/798; 118/620; 378/119; 355/75, 72, 355/30, 53, 71; 134/1, 1.1, 10, 21
See application file for complete search history.

(56) References Cited

U.S. PATENT DOCUMENTS

2005/0148210 A1* 7/2005 Bakker et al. ............ 438/798

2006/0278833 A1* 12/2006 Van Herpen et al. ... 250/492.22
2006/0289811 A1* 12/2006 Van Herpen et al. ... 250/504 R

FOREIGN PATENT DOCUMENTS

| EP | 1 429 189 A1 | 6/2004 |
|---|---|---|
| EP | 1 526 550 A1 | 4/2005 |
| EP | 1 643 310 A1 | 4/2006 |
| WO | WO 2006/0135230 A2 | 12/2006 |

OTHER PUBLICATIONS

International Search Report issued for International Patent Application No. PCT/NL2006/050303, dated Mar. 20, 2007.
Written Opinion of the International Searching Authority issued for International Patent Application No. PCT/NL2006/050303, dated Mar. 20, 2007.
D.J.W. Klunder, et al., "Debris Mitigation and Cleaning Strategies for Sn-Based Sources for EUV Lithography," Proceedings of SPIE, vol. 5751, pp. 943-951.
W. V. Smith, Journal of Chemical Physics, "The Surface Recombination of H Atoms and OH Radicals", pp. 110-125, (Mar. 1943).
Bernard J. Wood et al., J. Phys. Chem., "Kinetics of Hydrogen Atom Recombination of Surfaces", pp. 1976-1983, (Apr. 17, 1961).

* cited by examiner

*Primary Examiner*—Jack Berman
*Assistant Examiner*—Meenakshi S Sahu
(74) *Attorney, Agent, or Firm*—Pillsbury Winthrop Shaw Pittman, LLP

(57) ABSTRACT

An EUV lithographic apparatus includes an EUV radiation source, an optical element and a cleaning device. The cleaning device includes a hydrogen radical source and a flow tube in communication with the hydrogen radical source. The cleaning device is configured to provide a flow of hydrogen radicals and the flow tube is arranged to provide a hydrogen radical flow at a predetermined position within the lithographic apparatus, for example for cleaning a collector mirror.

27 Claims, 5 Drawing Sheets

LITHOGRAPHIC APPARATUS INCLUDING A CLEANING DEVICE AND METHOD FOR CLEANING AN OPTICAL ELEMENT

BACKGROUND OF THE INVENTION

1. Field of the Invention

The present invention relates to a lithographic apparatus including a cleaning device and a method for cleaning optical elements. The present invention further relates to a cleaning device and to a method for manufacturing a cleaning device.

2. Background of the Invention

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multi-layer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources will probably use tin or another metal vapor to produce EUV radiation. This tin may leak into the lithographic apparatus, and will be deposited on mirrors in the lithographic apparatus, e.g. the mirrors of the radiation collector. The mirrors of such a radiation collector may have a EUV reflecting top layer of, for example, ruthenium (Ru). Deposition of more than approximately 10 nm tin (Sn) on the reflecting Ru layer will reflect EUV radiation in the same way as bulk Sn. It is envisaged that a layer of a few nm Sn is deposited very quickly near a Sn-based EUV source. The overall transmission of the collector may decrease significantly, since the reflection coefficient of tin is much lower than the reflection coefficient of ruthenium. In order to prevent debris from the source or secondary particles generated by this debris from depositing on the radiation collector, contaminant barriers may be used. Though such contaminant barriers may remove part of the debris, still some debris will deposit on the radiation collector or other optical elements.

SUMMARY OF THE INVENTION

It is an aspect of the invention to provide a lithographic apparatus including a cleaning device, for example for cleaning Sn deposition from EUV reflective surfaces of e.g. a collector mirror. To that end, the invention relates in an embodiment to an EUV lithographic apparatus including An EUV radiation source; an optical element; and a cleaning device configured to provide a flow of hydrogen radicals, wherein the cleaning device includes a hydrogen radical source, and a flow tube in communication with the hydrogen radical source, and the flow tube is arranged to provide the hydrogen radical flow at a predetermined position within the lithographic apparatus, and at least part of the cleaning device exposed to hydrogen radicals includes a material having a hydrogen radical surface recombination coefficient $\leq 0.02$.

It is another aspect of the invention to provide a method for cleaning an optical element of a lithographic apparatus. To that end, the invention relates to a method for cleaning of one or more optical elements of an EUV lithographic apparatus, the method including providing a cleaning device configured to provide a flow of hydrogen radicals, wherein the cleaning device includes a hydrogen radical source, and a flow tube in communication with the hydrogen radical source, and the flow tube is arranged to provide the hydrogen radical flow at a predetermined position within the lithographic apparatus, and at least part of the cleaning device exposed to hydrogen radicals includes a material having a hydrogen radical surface recombination coefficient $\leq 0.02$; providing a hydrogen flow to the cleaning device; generating a hydrogen radical flow; and providing the hydrogen radical flow at a predetermined position within the lithographic apparatus.

It is yet another aspect of the invention to provide a cleaning device. Regarding this aspect, the invention relates to a cleaning device configured to provide a flow of hydrogen radicals, wherein the cleaning device includes a hydrogen radical source, and a flow tube in communication with the hydrogen radical source, and at least part of the cleaning device exposed to hydrogen radicals includes a material having a hydrogen radical surface recombination coefficient $\leq 0.02$.

Further, it is yet another aspect of the invention to provide a method for manufacturing a cleaning device. To that end, the invention provides a method of manufacturing a cleaning device configured to provide a flow of hydrogen radicals, the method including providing a hydrogen radical source and a flow tube in communication with the hydrogen radical source, wherein at least part of the cleaning device exposed to hydrogen radicals includes a material having a hydrogen radical surface recombination coefficient $\leq 0.02$.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
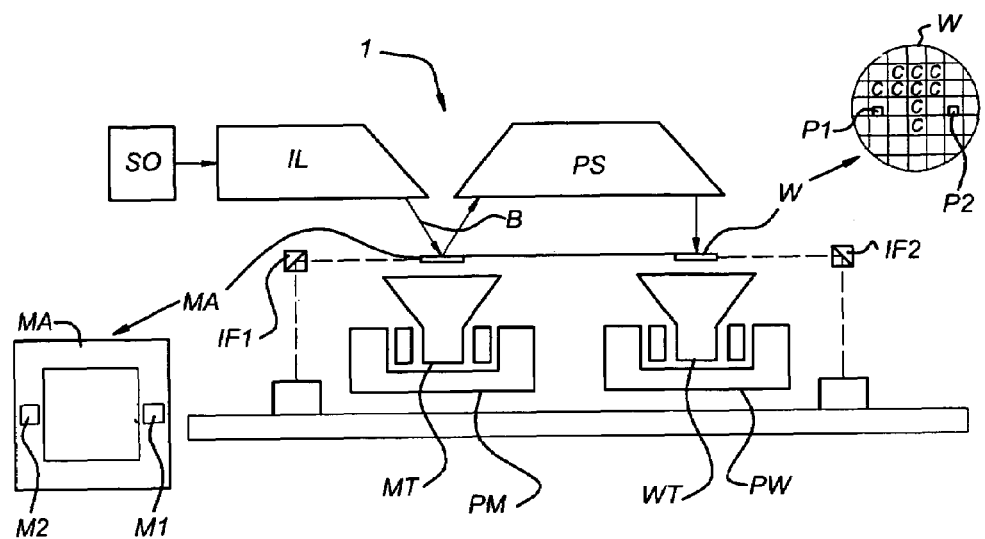
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including part of, one, or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an embodiment according to the invention, there is provided a lithographic apparatus including an illumination system configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate, and a cleaning device according to the invention.

The term "layer" is used herein as known to the person skilled in the art. The term "layer" may indicate a number of layers. They may also include one material or a combination of materials. For example, a coating may be a layer on top of part of an optical element. The term "coating" is a term well known to the person skilled in the art and refers to a layer on the surface of a material. In the context of this invention, a coating may be a substantially uniform, substantially homogenous layer of in a variant substantially uniform thickness, which partly, or in a variant, entirely covers a surface of interest to be coated, for instance for directing purposes of the hydrogen radical containing gas. The term "coating" also includes a multilayer coating. In the present invention, the term "material" may also be interpreted as a combination of materials. The coating may be applied with any known technique including hot filament deposit, sputtering or chemical vapor deposition processes. The thickness of the coating may be from about 2 nm and larger, e.g. 5-100 nm, or even higher 10-1000 nm. The person skilled in the art will choose the appropriate coating thickness.

The term "halogen containing gas" or "hydrogen containing gas" refers to gasses or gas mixtures including at least a halogen gas or hydrogen gas, respectively. The term "halogen" in the term "halogen containing gas" refers to at least one or more selected of F, Cl, Br and I, either as an atom (radical) or as compound, for example $F_2$, $Cl_2$, $Br_2$, $I_2$, HF, HCl, HBr, HI, interhalogen compounds, for example $ClF_3$, or other compounds including one or more selected of F, Cl, Br and I which can be brought into the gas phase at a temperature between about 50-500°. In an embodiment one or more of $F_2$, $Cl_2$, $Br_2$, $I_2$ may be used, in particular $I_2$. The terms "hydrogen" and "hydrogen radicals" imply to include their isotopes as well, in particular, deuterium. Hence, the term "hydrogen containing gas" refers to a gas including $H_2$ or deuterium or tritium analogues thereof. In an embodiment, the hydrogen containing gas includes one or more selected from the group consisting of $H_2$, HD, $D_2$, HT, DT, $T_2$. A halogen containing gas or a hydrogen containing gas may further include additional components like buffer gasses, such as Ar, etc. A "flow of hydrogen radicals" refers to a gas flow, wherein in the gas also hydrogen radicals are present. Usually, such a gas will also contain hydrogen molecules (like one or more of $H_2$, HD, $D_2$, HT, DT, $T_2$), since not all hydrogen may be converted into radicals, and due to radical recombination. The term "hydrogen radical containing gas" refers to a gas including hydrogen radicals or deuterium or tritium analogues thereof. Such gas may further include other components like $H_2$, etc., which has not been dissociated or has recombined from hydrogen radicals.

The term "lens", where the context allows, may refer to any one or combination of various types of optical components, including refractive, reflective, magnetic, electromagnetic and electrostatic optical components.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm, e.g. 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. The person skilled in the art understands that radiation having a wavelength in the range of, for example, 5-20 nm relates to radiation with a certain wavelength band, of which at least part is in the range of 5-20 nm.

The terms "cleaning device" and "cleaning method" refer to a device and a method that may be used in a cleaning process. As mentioned below, providing hydrogen radicals may be used for reduction of oxides, like Sn oxides and in a next step, halogens (like for instance I2) may remove the metal, like Sn (by the formation of halides). Hence, "cleaning" in this context does may imply a complete or partial removal of undesired deposition but may also imply a part of a cleaning process, like a reduction (without substantially removing deposition). Therefore, the term "cleaning" also includes treating with a gas in the course of a cleaning of a cleaning process. Further, in an embodiment hydrogen radicals may nevertheless be used to remove deposition.

A "predetermined position" especially refers to a position close to one or more surface(s) of an optical element or optical elements which is to treated with the hydrogen radical flow and to which at least part of the hydrogen radical flow is to be provided. There may be more than one predetermined positions. For example, a whole surface is to be cleaned. In such case, the predetermined position is such that at least part of the hydrogen radical gas flow from one or more outlets of the flow tube reaches the entire surface to be cleaned. Further, in an embodiment a plurality of surfaces may have to be cleaned e.g. a number of reflectors of a collector mirror. In such a case the predetermined position is such that at least part of the hydrogen radical gas flow from one or more outlets of the flow tube reaches the plurality of surfaces to be cleaned. The term "in communication" especially refers to gaseous communication, i.e. that gas may be transferred from one volume to another volume since these volumes are in communication, as will be clear to the person skilled in the art. In an embodiment, as for instance described and depicted in a number of variants below, the phrase "a hydrogen radical source, and a flow tube in communication with the hydrogen radical source" may refer to a hydrogen radical source, the hydrogen radical source further including an inlet for a hydrogen containing gas and an outlet for the flow of hydrogen radicals, and a flow tube, the flow tube including an inlet and an outlet, wherein the inlet of the flow tube is connected to the outlet of the hydrogen radical source.

Figure 2:
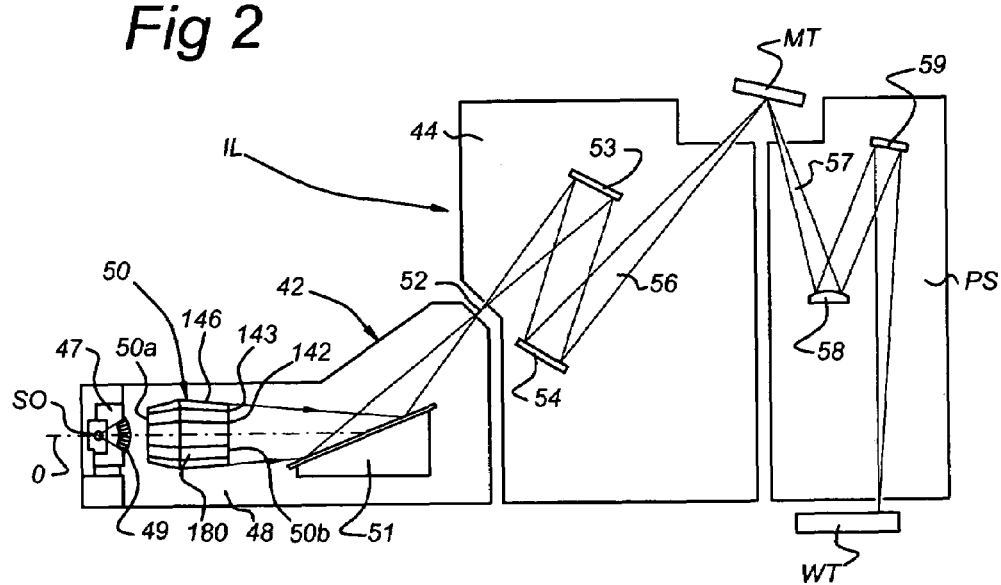
FIG. 2 schematically depicts a side view of an EUV illumination system and projection optics of a lithographic apparatus according to FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 which is positioned in or behind an opening in source chamber 47. The gas barrier 49 may include a channel structure.

The collector chamber 48 includes a radiation collector 50 which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present than 58, 59. Radiation collectors 50 are known from the prior art. A space 180 is provided between two reflectors, e.g. between reflectors 142 and 143.

All optical elements shown in FIG. 2 (and optical elements not shown in the schematic drawing of this embodiment) are vulnerable to deposition of contaminants produced by source SO, for example, Sn. This is the case for the radiation collector 50 and, if present, the grating spectral filter 51. Hence, the cleaning device according to the invention may be used to clean one or more of these optical elements as well as the cleaning method of the present invention may be applied to those optical elements, but also to normal incidence reflectors 53, 54 and reflective elements 58, 59 or other optical elements, for example additional mirrors, gratings, etc.

Radiation collector 50 may be a grazing incidence collector. The collector 50 is aligned along an optical axis O. The source SO or an image thereof is located on optical axis O. The radiation collector 50 may include reflectors 142, 143, 146. Sometimes they are also called shells. These reflectors 142, 143, 146 may be nested and rotationally symmetric about optical axis O. In FIG. 2 (as well as in other Figures), an inner reflector 142, an intermediate reflector 143, and an outer reflector 146 are depicted. The radiation collector 50 encloses a certain volume, i.e. the volume within the outer reflector(s) 146. Usually, this volume within outer reflector(s) 146 is circumferentially closed, although small openings may be present. All the reflectors 142, 143, 146 include surfaces of which at least part includes a reflective layer or a number of reflective layers. Hence, reflectors 142, 143, 146 (more reflectors may be present and are included herein), include at least part designed to reflect and collect EUV radiation from source SO, and at least part of the reflector may not be designed to reflect and collect EUV radiation. For example, at least part of the back side of the reflectors may not be designed to reflect and collect EUV radiation. The latter part may also be called back side. On the surface of these reflective layers, there may in addition be a cap layer for protection or as optical filter provided on at least part of the surface of the reflective layers.

The radiation collector 50 is usually placed in the vicinity of the source SO or an image of the source SO. Each reflector 142, 143, 146 may include at least two adjacent reflecting surfaces, the reflecting surfaces further from the source SO being placed at smaller angles to the optical axis O than the reflecting surface that is closer to the source SO. In this way, a grazing incidence collector 50 is configured for generating a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

During use, on one or more of the outer 146 and inner 142/143 reflector(s) deposition may be found, especially Sn when a Sn source SO is used. Deposition of Sn, for example due to a Sn source, may, after a few mono-layers, be detrimental to reflection of the radiation collector 50 or other optical elements, which may necessitate the cleaning of such optical elements.

Detrimental herein refers to reduction and loss of reflectivity of those reflecting surfaces of the reflector or mirror that is designed to reflect (and/or collect) radiation. Deposition may also be detrimental to the surface (that is designed to sense) of for instance an optical sensor.

Deposition, especially deposition including Sn, may be removed in an embodiment by halogens (as gasses), for example, $F_2$, $Cl_2$, $Br_2$ and $I_2$ and, in another embodiment by hydrogen radicals, and in yet a further embodiment by combinations of hydrogen radicals and one or more halogens, either applied simultaneously or subsequently. In case there is a deposition with e.g. Sn, due to the presence of small amounts of oxygen, there will usually also be to some extent Sn oxide. To remove Sn oxides, a reduction step may be necessary before elemental Sn can be removed in an embodiment with a halogen gas by the formation of halogenides, followed by a removal of the reduced oxide with hydrogen radicals with the formation of hydrides. Hence, hydrogen radicals, either for a reduction or for a removal have to be provided to at least part of a surface of collector mirror 50, or at least part of a surface to be cleaned of other optical elements. Such surfaces are e.g. the EUV reflecting surfaces of reflectors 142, 143 and 146 which are contaminated with deposition like Sn.

Figure 3A:
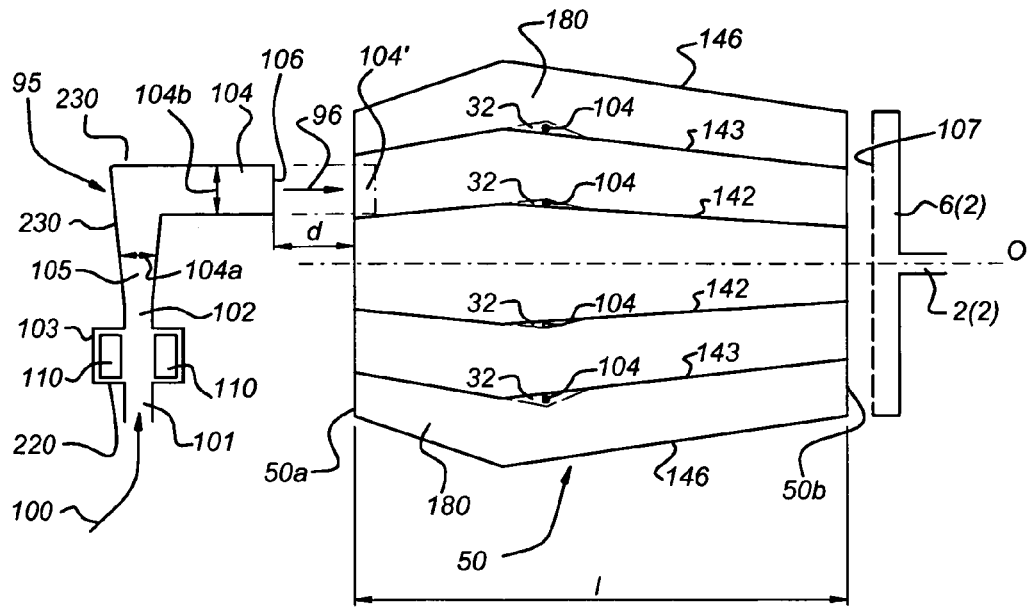
FIGS. 3a-3c schematically depict a number of embodiments and variants of the cleaning device according to the invention, for example for use in cleaning at least part of the collector.
Figure 3B:
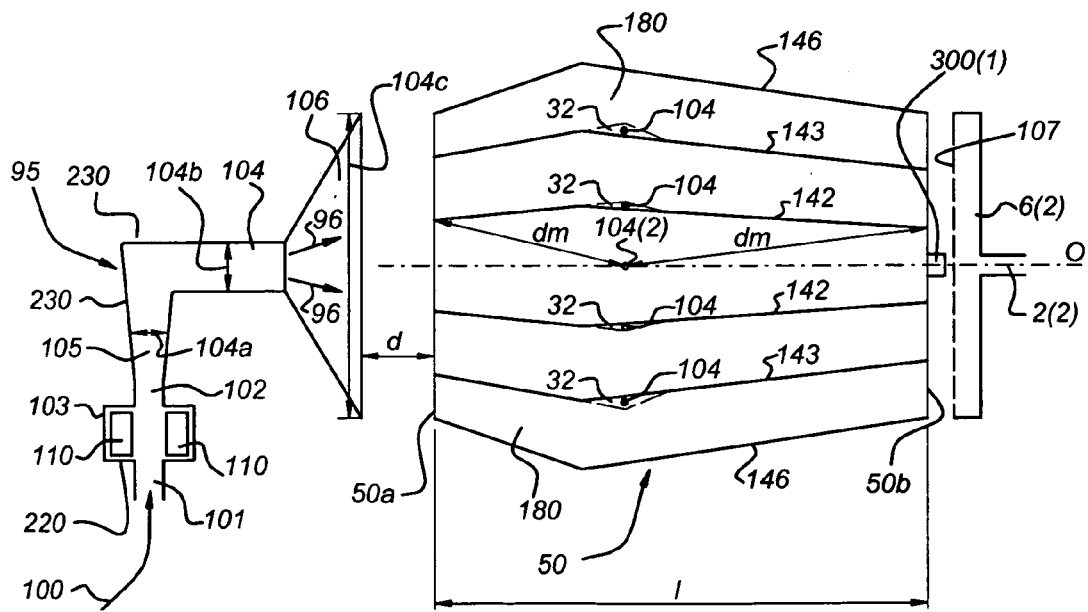
Figure 3C:
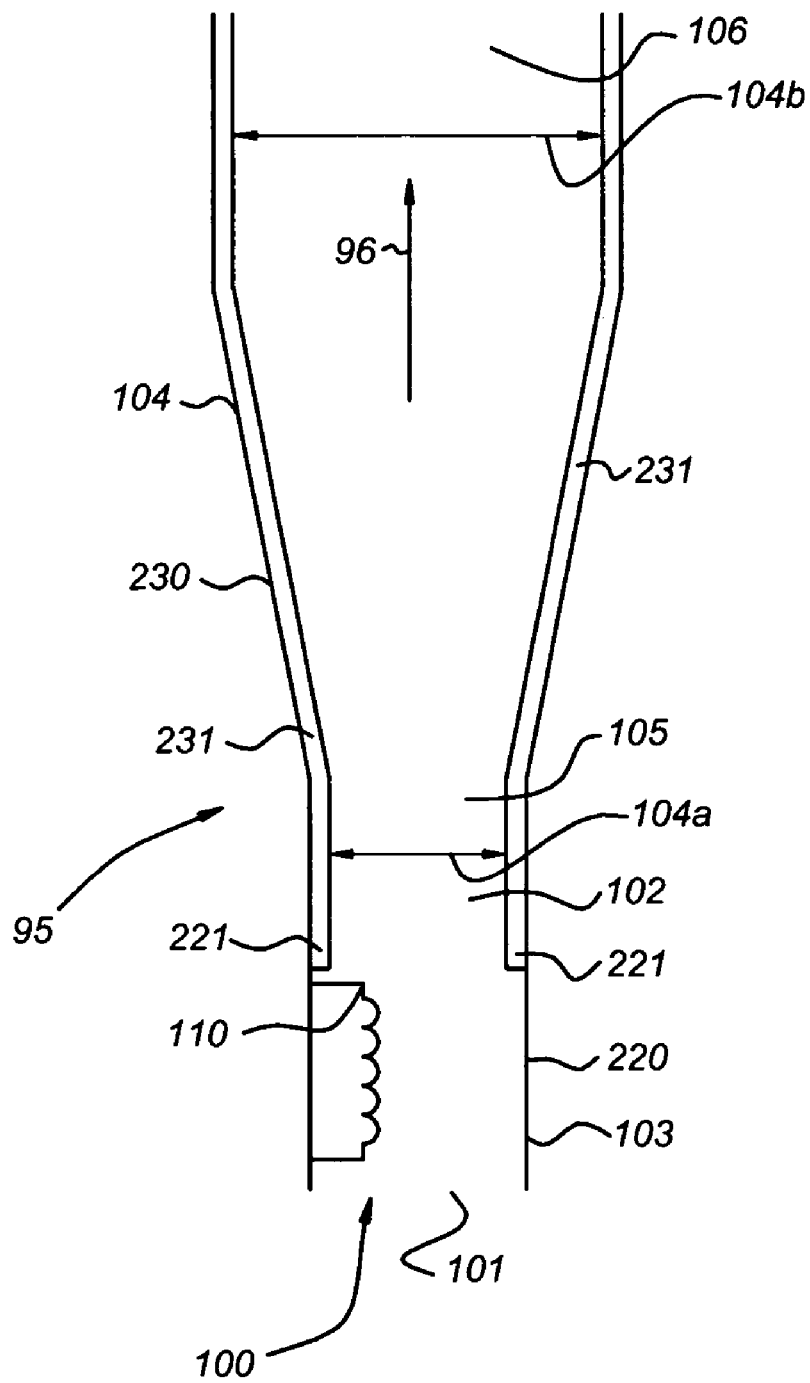

Referring to FIGS. 3a-3c, a cleaning device 95 is configured to provide a flow 96 of hydrogen radicals, wherein cleaning device 95 includes i) a hydrogen radical source 103, hydrogen radical source 103 further including an inlet 101 for a hydrogen containing gas (flow) 100 and an outlet 102 for flow of hydrogen radicals 96, and ii) a flow tube 104, flow tube 104 including an inlet 105 and an outlet 106, wherein inlet 105 of flow tube 104 is connected to outlet 102 of hydrogen radical source 103, and at least part of cleaning device 95 exposed to hydrogen radicals includes a material having a hydrogen radical surface recombination coefficient $\leq 0.02$.

Hydrogen radical source 103 includes an inlet 101 for the $H_2$ containing gas 100, for example an $H_2$ flow. A suitable source for the $H_2$ containing gas 100 may be chosen. Hydrogen radical source 103 further includes one or more units 110 designed to convert at least part of the $H_2$ gas into H radicals. In an embodiment, hydrogen radical source 103 includes one or more hydrogen radical producing sources 110 selected from the group of oscillating field electrodes, a magnetron RF generator, and one or more hot filaments. In an embodiment, the hot filament 110 can be e.g. a W (tungsten) or Ta (tantalum) wire or coil (or another material), which can be heated to e.g. 1500-3000 K or even above, depending upon the kind of material and desired temperature and required temperature to dissociate the chemical bonds of $H_2$ of at least part of all $H_2$ molecules in the $H_2$ containing gas 100. For example, a plasma may be generated by one or more electrodes 110, such that hydrogen radicals are created. A high voltage, for example about 5-10 kV, between two electrodes, thereby forming a plasma, can be used. Pumps, $H_2$-containing gas reservoirs, etc., arranged to provide the $H_2$ containing gas (flow) to hydrogen radical source 103 may also be present (but are not depicted). Due to the presence of one or more hydrogen radical forming units 110, at least part of the $H_2$ in flow 100 is converted into H-radicals, thereby providing a hydrogen radical containing gas 96. At least part of this hydrogen radical containing gas 96 leaves hydrogen radical source 103 via outlet 102, and enters flow tube 104 at inlet 105.

As a result of the flow input to inlet 101, there is a driving force of the hydrogen radical containing gas towards opening 106. This opening may be positioned at a predetermined position within an apparatus, e.g. lithographic apparatus 1. Then, at this predetermined position, the H radicals may contribute to a cleaning process of at least part of a surface of the optical element.

In an embodiment, a lithographic apparatus 1 or a cleaning process, etc., according to the invention is provided, wherein the one or more optical elements are selected from the group of multilayer mirrors, normal incidence mirrors, grazing incidence mirrors, collector mirrors, reticles, filters, apertures, masking blades, gratings and optical sensors. Since collector mirror 50 is usually the first optical element in the system downstream of source SO, cleaning of collector mirror 50 is one of the embodiments of the invention. Hence, the description of the invention is concerned with cleaning of the collector mirror 50 and a cleaning device 95, and especially flow tube 104, is arranged such that collector mirror 50 can be treated with hydrogen radicals present in hydrogen radical containing gas 96. However, the invention may also be applied to other multilayer mirrors, normal incidence mirrors, grazing incidence mirrors, reticles, filters, apertures, masking blades, gratings and optical sensors, etc. and the invention is not limited to only cleaning and providing the hydrogen radical flow 96 at collector mirror 50 (at this predetermined position).

In an embodiment, at least part of the cleaning device 104 exposed to hydrogen radicals (i.e. the internal surface (walls) of hydrogen radical source 103 and the internal walls of flow tube 104) includes a material having a hydrogen radical surface recombination coefficient of $\leq 0.02$, and in a variant a hydrogen radical surface recombination coefficient ≦0.001. Using such a material or combination of materials that fulfill this criterion appear to provide a decrease in hydrogen radical recombination compared to materials having a hydrogen radical surface recombination coefficient >0.02. Information on recombination coefficients can be found in the literature, in particular W. V. Smith, "The surface recombination of H atoms and OH radicals", J. Chem. Phys. 11, 110-125 (1943) and B. J. Wood, H. Wise, "Kinetics of Hydrogen Atom Recombination on Surfaces", J. Phys. Chem. 65, 1976-1983 (1961).

The following Table 1 illustrates a number of materials and their respective surface recombination coefficients for hydrogen radicals.

TABLE 1

Hydrogen surface recombination coefficient $\gamma$ for various materials

| Material | Surface recombination coefficient |
|---|---|
| Syrupy phosphoric acid | $2 \times 10^{-6}$ |
| KOH | $2 \times 10^{-6}$ |
| Metaphosphoric acid | $2 \times 10^{-5}$ |
| KCl | $2 \times 10^{-5}$ |
| Quartz (room temperature) | $7.0 \times 10^{-4}$ |
| Quartz (300-500° C.) | $3 \times 10^{-3}$ |
| PYREX ® | $4 \times 10^{-3}$ |
| $K_2CO_3$ | >0.05 |
| W | 0.06 |
| $K_2SiO_3$ | 0.07 |
| Sodium Phosphate | >0.07 |
| Pd | 0.08 |
| Cu | 0.1 |
| Ni | 0.2 |
| $Al_2O_3$ | 0.33 |
| Ti | 0.4 |
| $ZnO \cdot Cr_2O_3$ | 0.6 |
| Pt | 1 |
| TEFLON ® | $\sim 4 \times 10^{-4}$ |
| Fused silica | $\sim 6 \times 10^{-4}$ |
| Si | $\sim 1 \times 10^{-3}$ |
| $Si_3N_4$ | $\sim 1 \times 10^{-3}$ |
| Ru | $\sim 0.1$ |
| Sn | 0.03 |

In an alternative embodiment, the hydrogen radical surface recombination coefficient of at least part of the cleaning device exposed to the radicals includes a material having a hydrogen radical surface recombination coefficient smaller than Ru and in yet another alternative embodiment, a hydrogen radical surface recombination coefficient smaller than Sn.

Herein the phase "at least part of the cleaning device exposed to the radicals" refers to at least part of the internal surface of hydrogen radical source 103 and flow tube 104. In FIG. 3c, the cleaning device 95 is schematically depicted in more detail. The internal surface is indicated in FIG. 3c as inner surfaces 221 and 231 of walls 220 and 230 of hydrogen radical source 103 and flow tube 104, respectively. Downstream internal surface 221 of hydrogen radical source 103, and downstream internal surface 231 of flow tube 104, or at least part of these surfaces, may come into contact with the hydrogen radicals which are generated by the one or more hydrogen radical forming units 110, which contact may lead to recombination. Hence, to this end at least part of internal surface 221 and/or at least part of internal surface 231 may include a material having a hydrogen radical surface recombination coefficient ≦0.02. In yet another embodiment, the material is selected from one or more materials from the group of KOH, KCl, quartz, PYREX® (borosilicate glass), glass, TEFLON® (polytetrafluoroethylene), fused silica, Si, and $Si_3N_4$. As will be clear to the person skilled in the art, such surface may be coated with this suitable material (hydrogen radical surface recombination coefficient ≦0.02), thereby providing a coating (like a $Si_3N_4$ coating, a PYREX® coating, a PYREX® coating, etc.) having a hydrogen radical surface recombination coefficient of about ≦0.02, but some of the materials fulfilling the criterion of hydrogen radical surface recombination coefficient of about ≦0.02 may also be used as sole material of at least part of hydrogen radical source 103 or flow tube 104 or both. For example, at least part of flow tube 104 or in an embodiment the entire flow tube 104 may be of a material including PYREX® or quartz, etc. The wall 230 and internal surface 231 and/or wall 220 and internal surface 221, respectively may at least partly or substantially be of a material including PYREX® or quartz, etc. In a specific embodiment, materials are selected having a hydrogen radical surface recombination coefficient of about ≦0.01, more specifically about ≦0.001.

In an embodiment, there is provided a material with a recombination coefficient less than 0.01. In yet another embodiment, there is provided a cleaning device 95 according to the invention, or a lithographic apparatus 1 including cleaning device 95 according to the invention, wherein the recombination coefficient is less than 0.001. In yet another embodiment, the material is hydrogen radical resistant, i.e. the material has a relative low etch rate. In yet another embodiment, the material has relative low hydrogen embrittlement (getting brittle under influence of hydrogen). In yet a further embodiment, the material has a low etch rate and has a relative low hydrogen embrittlement. In yet a further embodiment, a material is selected, wherein the etch rate of the material is less than ten times an etch rate of tin at a predetermined hydrogen radical partial pressure (i.e. under the same conditions of pressure, temperature, etc.). In another embodiment, the etch rate of the material is less than twenty times an etch rate of tin at a predetermined hydrogen radical partial pressure. In yet a further embodiment, the etch rate of the material is less than 50 times an etch rate of tin at a predetermined hydrogen radical partial pressure.

Referring to FIGS. 3a, 3b, 4b and 4c, a collector mirror 50 is schematically depicted as an optical element of which at least part of the surface may have to be cleaned or treated with hydrogen radicals. For example, reflectors 142, 143 and 146 are provided with a one or more mirror surfaces, e.g. having a Ru surface. This Ru surface may be contaminated or deteriorated by Sn deposition. Hence, in an embodiment flow tube 104 is arranged such that outlet 106 of flow tube 104 is provided within (i.e. equal to or less than) a distance d of 50 cm from at least part of one or more surfaces of the one or more optical elements (here collector mirror 50) to be cleaned and wherein flow tube 104 is arranged such that at least part of hydrogen radical flow 96 is directed to at least part of the one or more surfaces to be cleaned. This distance d is a shortest distance from opening 106 to a surface to be treated (predetermined position to which at least part of the hydrogen radical flow is to be provided), as schematically indicated. Examples are indicated in FIGS. 3a, 3b, 4b and 4c.

In an embodiment the distance d is equal to or less than 20 cm from at least part of one or more surfaces of the one or more optical elements to be cleaned, and in a further embodiment the distance is equal to or less than 10 cm from at least part of one or more surfaces of the one or more optical elements to be cleaned. Hence, in an embodiment, distance d is ≦10 cm. In another embodiment, distance d is ≦5 cm, and yet in another embodiment, distance d is ≦1 cm.

In an embodiment, wherein the optical element is collector mirror 50, collector mirror 50 including a plurality of reflectors (like schematically depicted with reference numbers 142, 143 and 146), flow 104 tube is arranged (or arrangeable) such, that at least part of the hydrogen radical flow 96 is directed to at least part of a space 180 enclosed by two reflectors.

Referring to FIGS. 3a and 3b, the distance d from opening 106 to collector mirror 50, e.g. to reflectors 142 and 143 (a surface to be treated) may be 10 cm or less. However, this is the shortest distance to a surface to be treated. Since further within collector mirror 50 the reflectors may also have to be cleaned, distance d from opening 106 to such predetermined position may be e.g. the distance from opening 106 to (referring to for instance FIGS. 3a and 3b) the end 50b of collector mirror 50. In an embodiment, a maximum distance from opening 106 of cleaning device 95 to a predetermined position to be cleaned by this cleaning device 95 is ≦50 cm. In another embodiment, the maximum distance from opening 106 of cleaning device 95 to a predetermined position to be cleaned by this cleaning device 95 is ≦20 cm, or ≦20 cm. To reduce the maximum distance (i.e. minimize loss of hydrogen radicals, by e.g. three body recombination), more than one cleaning devices may be used or at least part of flow tube 104 may be arranged within collector mirror 50.

In an embodiment wherein the optical element is collector mirror 50, at least part of flow tube 104 may be arranged within collector mirror 50. For example, flow tube 104 as schematically depicted in FIG. 3a may be slid or may be arranged into the space 180 enclosed by two reflectors, e.g. between reflector 142 and 143 in FIG. 3a. The penetration of flow tube 104 into collector mirror 50 may take place from side 50a or side 50b or both, when there are e.g. more than one flow tubes 104 and/or more than one cleaning devices 103. This means that the predetermined position is within collector mirror 50 in space 180 between reflectors. Penetration is schematically indicated with reference number 106'. In case flow tube 104 includes more than one openings 106, the more than one openings 106 may penetrate simultaneously collector mirror 50.

Referring to FIGS. 3a-3c, in an embodiment the flow tube 104 has a first cross section (104-a) close to the inlet 105 of the flow tube 104 and a second cross section (104-b) close to outlet 106 of the flow tube 14 (i.e. the first cross section 104-a is upstream relative to the second cross section 104-b), wherein the quotient of the first and second cross section is ≦1. In a further embodiment, the quotient is <1. In another embodiment, the quotient is ≦2 and in a specific variant ≦10. By providing a flow tube with a gradual or sudden increase in width and breadth (or diameter) (i.e. an increase in cross section), hydrogen radical recombination can be decreased. For illustration, FIG. 3c schematically shows three cross sections 104-a, 104-b, 104-c of flow tube 104, (i.e. opening 106 of this embodiment of flow tube 104), wherein the cross section increases with distance from hydrogen radical source 103. This may be a continuous or step wise increase in cross section.

In an embodiment, at least part of the flow tube 104 is movable. In this way, flow tube(s) 104 can be arranged at the predetermined positions within the lithographic apparatus 1 and optical elements can be cleaned during e.g. down time. After cleaning, the flow tube(s) 104 are removed, such that radiation can propagate without being hindered by the presence of flow tube(s) 104. Moveable flow tubes 104 may be of relevance when the flow tube is arranged at one end 50a and/or the other end 50b of collector mirror 50, thereby by blocking part of the radiation.

Cleaning device 95 may further be equipped with an exhaust 6(2), for example to be arranged downstream of hydrogen radical flow 96. Referring to FIGS. 3a and 3b, exhaust 6(2) is arranged at end 50b, downstream of opening(s) 106 of device 95. In this way, gas and gaseous products may be removed from the volume enclosed by collector mirror 50. Exhaust 6(2) may have one or more inlets 107, and an outlet 2(2) which may be connected with a pump (not shown).

Figure 4A:
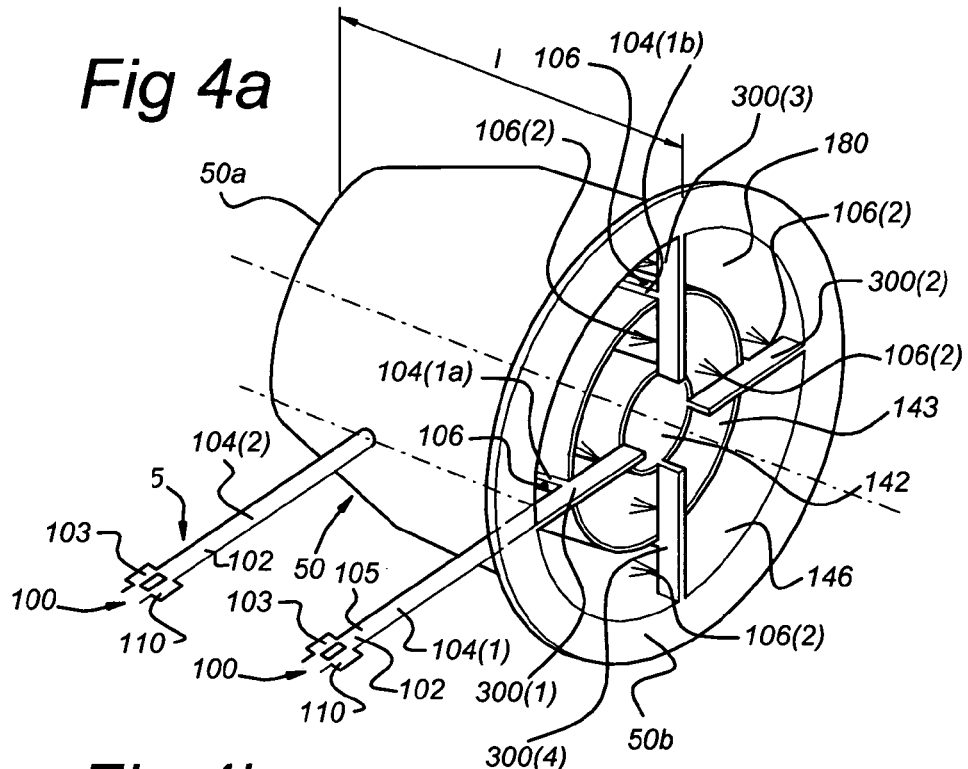
FIGS. 4a-4c schematically depict embodiments and variants of the flow tube of the cleaning device according to the invention, for example for use in cleaning at least part of the collector.

In yet a number of other embodiments, part of the flow tube 104 is integrated with collector mirror 50. Referring to FIG. 4a, a perspective front/side view is shown of an embodiment of collector mirror 50. Reflectors 142 (inner), 143 and 146 (outer) are shown, although more reflectors may be present. In the embodiment of this figure, one or more intersection constructions 300 are present, indicated in FIG. 4a with intersection constructions 300(1)-300(4). Intersection constructions 300 may connect two or more reflectors and intersect at least part of the volume enclosed by outer reflector 146. Intersection constructions 300 may be used as support for the reflectors and may form a so-called "spider wheel". One or more of such spider wheels may be present, each including one or more intersection constructions 300. In FIG. 4a, the spider wheel includes four intersection constructions (300(1)-300(4), respectively), but more or less intersection constructions can be present on one spider wheel. Intersection constructions may be present at the end of the reflectors, e.g. at end 50a and/or end 50b (see FIG. 2), but may also be arranged in collector mirror 50 at one or more positions within collector mirror 50 between opening 50a and opening 50b. In FIG. 4a, an embodiment is shown wherein at one end of collector mirror 50, flow tube 104(1) is integrated into an intersection construction 300(1), but more flow tubes 104 may be integrated into (other) intersection constructions 300 (like 300(2), 300(3), etc.).

In FIG. 4a, an intermediate flow tube 104(2) provides a hydrogen radical containing gas to collector mirror 50 somewhere in between one end 50a and one end 50b. For example, assuming that collector mirror 50 has a certain collector length l between end 50a and 50b, for example 20 cm, flow tube 104(2) may in an embodiment penetrate collector mirror 50 at 30-70% of the collector length l. In an embodiment, flow tube 104(2) may penetrate collector mirror 50 at 40-60% of the collector length l. Note that penetration in view of FIG. 3a refers to a movement from the outside into collector mirror 50 through opening 50a or 50b (or both), whereas here penetration refers to a sideways entrance of collector mirror 50. Penetrating at 50% collector length l would imply exactly halfway, thereby providing a maximum distance dm to a surface to clean (i.e. reflecting surfaces of one or more of reflectors 142, 143 and 146 (etc.) of about 10 cm. The minimum distance d will be the shortest distance of an opening 106 in flow tube 104 to a closet predetermined surface to clean. Penetrating at e.g. 40%, would imply a maximum distance dm of d to end 50a (maximum distance to a surface to clean, i.e. the reflecting surface of a reflector at edge 50a) of about 8 cm and a maximum distance dm to end 50b of about 12 cm.

Hence, one or more intermediate (i.e. between ends 50a and 50b) flow tube(s) 104(2) are provided in between both ends 50a and 50b, either as intermediate flow tube(s) 104(2) alone or as flow tube(s) 104(2) integrated in an intermediate intersection construction 300. Referring to FIG. 4a, collector mirror 50 includes next to reflectors at least one "spider wheel" with two or more intersection constructions 300, arranged at end 50a or 50b, as support for the reflectors. Intermediate flow tube(s) 104(2) are arranged such that the intermediate flow tubes 104(2) (either as flow tube 104(2)) alone or integrated in/on intersection construction 300 (not visible in this figure, because within collector mirror 50)) are with respect to the radiation propagating through collector mirror 50 in line with at least one intersection construction of the "spider wheel." For example referring to FIG. 4a, flow tube 104(2) (either as flow tube or as intermediate intersection construction) penetrates collector mirror 50 and is configured such that radiation entering collector mirror 50 from the 50a side intercepts the radiation in such a way that intersection construction 300(1) is at least partially arranged in the shadow created by intermediate flow tube 104(2) or the shadow created by intermediate flow tube 104(2) is smaller than intersection construction 103(1). This means that loss of radiation is minimized. In FIG. 3b an embodiment of such an intermediate flow tube 104(2) in line of sight with construction element 300(1) is shown. Herein, intersection construction 300(1) is used as example: there may be more intermediate flow tubes 104(2), for example arranged in line of sight with other intersection constructions (300(2), 300(3), etc.). To elucidate this with a side view, FIG. 3b shows an example of an intermediate flow tube 104(2), which is in line of sight with intersection construction 300(1). The maximum distance to a surface to clean is indicated with length dm.

In another embodiment, one or more of flow tubes 104(1) and/or 104(2) (e.g. when not integrated 104(2) in an intersection construction 300) are movable, and only substantially penetrate collector mirror 50 during down time (cleaning time).

Figure 4B:
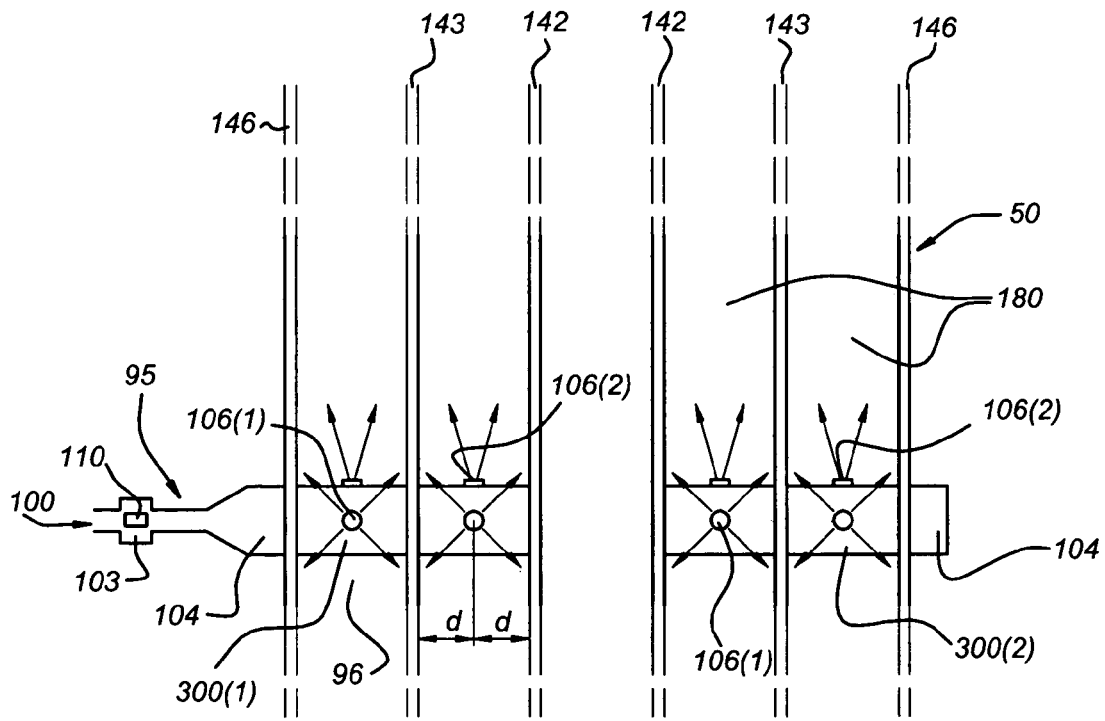

FIG. 4b shows a top view of a cross section of part of collector mirror 50. An intersection construction is provided somewhere between both ends of collector mirror 50 (those ends are not shown). Intersection constructions 300 are usually selected such and positioned (at one or more of end 50a, end 50b or one or more positions between end 50a and end 50b of collector mirror 50) such that interruption of radiation is minimized. Intersection constructions 300 may include at least part of flow tube 104, i.e. flow tube 104 is integrated within collector mirror 50 and thereby forms an intersection construction 300. However, in another embodiment, intersection constructions 300 may e.g. be used to provide or evacuate gasses, as suppors for two or more reflectors ("spider wheel"), etc., and at least part of flow tube 104 is integrated in or on intersection construction 300.

In FIG. 4b, a top view of a cross section of collector mirror 50 is shown. Reflecting mirrors 142, 143 and 146 are present, and an intersection construction 300(1), connecting the left part of collector mirror reflectors 146, 143 and 142 at the left hand, and an intersection construction 300(2) at the right hand the right part of reflectors 142, 143 and 146 and connecting these, respectively. Intersection construction 300 is either a flow tube 104, or a flow tube 104 is integrated into or on intersection construction 300. Outlets 106 are present for providing hydrogen radical gas flow 96. Distance d is the shortest distance from an opening 106 to a surface to be cleaned of one of the reflectors. Outlets 106 may be provided at different positions, as indicated with "top" outlets 106(1) and "side" outlets 106(2). The term "top outlets 106(1)" also includes embodiments wherein inlets are present elsewhere in or on flow tube 104, like outlets at the side not directed to the viewer ("down outlets"). It should be appreciated that different configurations on or in flow tube 104 of outlets are possible.

Figure 4C:
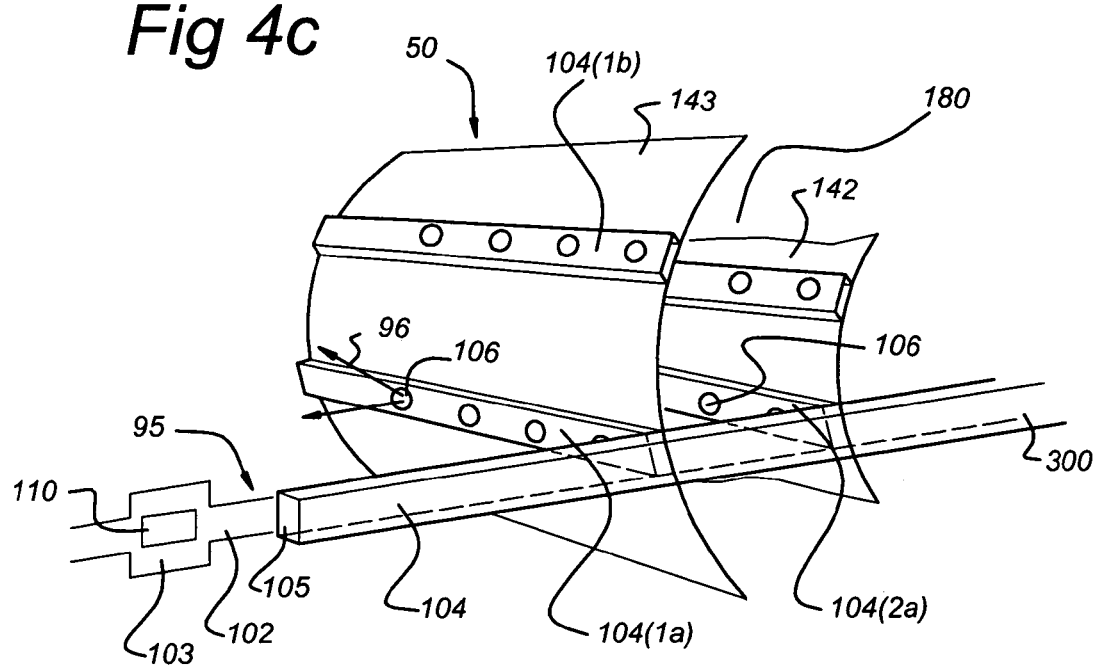

Instead of, or in addition to, intersection construction 300, or in instead of or in addition to providing outlet 106 at one end 50a and/or one end 50b of collector mirror 50, as schematically shown in FIGS. 3a and 3b and as described above, or instead of, or in addition to, sliding flow tube 104 between reflectors as described above, in an embodiment at least part of flow tube 104 is provided on one or more reflectors 142, 143 and 146 (see FIG. 4c, which schematically depicts a small part of some reflectors). In a further embodiment, this at least part of flow tube 104 is substantially or entirely provided on the reflectors on those parts where the reflectors are not irradiated by the source. Hence, in an embodiment there is provided cleaning device 95, wherein the optical element to be (at least partially) cleaned is collector mirror 50 and wherein at least part of the flow tube 104 (especially branch tubes 104(1a), 104(2a), etc. as indicated in FIG. 4c and also in FIG. 4a) is arranged on at least part of the non-reflecting part of a reflector (142, 143, etc.) of the collector 50. Such branch tubes may have a plurality of openings 106. Each reflector (shell) may have more than one branch tubes integrated in one or more non-reflecting parts of the reflector (i.e. parts of the reflector not designed to reflect EUV radiation; no EUV mirror surface). Parts not irradiated by the source may be selected from the group of the back sides of the reflectors. However, also shadow areas 32 may be selected to arrange flow tubes 104 (branch tubes 104(1a), or intermediate tubes 104(2), etc.).

In FIG. 4c, at least part of flow tubes 104 are arranged horizontally, but it should be appreciated that there are other orientations. For example, assuming that flow tubes 104 are arranged at a non-reflecting part of the surface of the reflectors (shadow), radiation of source SO is reflected at the side of reflector 143 and 142 not directed to the viewer (i.e. the concave part).

In, or on, the non-reflecting part of the surface of the reflector (indicated in FIG. 3a with areas 32 and/or on the back side(s) of the reflectors), one or more flow tubes 104 may be arranged, each flow tube having one or more outlets 106. Flow tubes present in shadow areas 32 are also indicated in FIG. 3a, wherein within shadow area 32, flow tubes 104 (side view) are schematically depicted. Hence, in an embodiment the optical element is a collector mirror 50 and at least part of the flow tube 104 is arranged in shadow area 32 of a reflector of collector 50. It should be appreciated that there is more than one shadow area 32 and more than one flow tubes 104 (or branches thereof) may be arranged in such shadow areas 32, respectively (see also FIGS. 3a and 3b).

Referring to FIG. 4c, e.g. intersection construction 300 may be designed to include, or to incorporate, a flow tube 104, with a number of branch tubes 104. Hence, in an embodiment the flow tube 104 includes a plurality of branch tubes 104 (e.g. as schematically in FIG. 4c with reference numbers 104(1a), 104(2a); more branch tubes 104 may be present), each branch tube 104 (104(1a), 104(2a)) having at least one outlet 106, the branch tubes 104 (104(1a), 104(2a)) being arranged downstream with respect to the inlet 105 of the flow tube 104. Of course, more branch tubes 104(1a), 104(2a) may be present.

In an embodiment, there is provided an EUV lithographic apparatus 1, wherein the lithographic apparatus includes a plurality of cleaning devices 95 according to the invention. According to yet another embodiment, there is provided a cleaning device 95, e.g. for use in an EUV lithographic apparatus, wherein the cleaning device 95 includes a plurality of outlets 102, e.g. to direct the hydrogen radical containing gas 96 to a number of flow tubes 104. In yet another embodiment, there is provided a cleaning device 95, wherein the cleaning device 95 includes a plurality of flow tubes 104, as e.g. shown in FIG. 4c. In another embodiment, the flow tube 104 includes a plurality of inlets 105. In a next embodiment, the flow tube includes a plurality of outlets, as e.g. shown in FIGS. 4b and 4c.

In an embodiment of the invention, cleaning device 95, lithographic apparatus 1, or both, further include a temperature control unit configured to regulate and/or maintain the temperature of the hydrogen radical containing gas of the hydrogen radical flow at a temperature between room temperature and 150° C. such that the optical element is treated with a gas flow of (substantially) this temperature. For example, the temperature of the hydrogen radical containing gas may be between about 20 and about 150° C. for a collector treatment and between about 20° C. and 70° C. for a multi-layer mirror treatment. Further, cleaning device 95 may further include a control unit configure to control one or more hydrogen radical producing sources 110 selected from the group of one or more oscillating field electrodes, a magnetron RF generator and one or more hot filaments.

According to another aspect, there is provided a method for cleaning of one or more optical elements of EUV lithographic apparatus 1, including providing cleaning device 95, providing hydrogen flow 100 to the cleaning device 95, generating a hydrogen radical flow 96; and providing the hydrogen radical flow 96 at a predetermined position within the lithographic apparatus. In a further embodiment, the cleaning method further includes providing a halogen gas at the predetermined position within the lithographic apparatus. The halogen containing gas can be provided at the same time or at a different time when providing the hydrogen radical containing gas 96. Flow tube 104 may be used for transport of the halogen containing gas. In one regime, first hydrogen radicals and then halogen gas is provided; in a second regime, the process of providing halogen gas (after providing hydrogen radicals) is followed by a second process of providing hydrogen radicals at the predetermined position within the lithographic apparatus. The hydrogen containing gas includes one or more selected from the group of $H_2$, HD, $D_2$, HT, DT, $T_2$.

According to yet another aspect of the invention, there is provided a method of manufacturing cleaning device 95 according to the invention, the cleaning device 95 configured to provide flow 96 of hydrogen radicals, including providing hydrogen radical source 103, the hydrogen radical source 103 further including inlet 101 for hydrogen containing gas 100 and outlet 102 for the flow of hydrogen radicals 96, and flow tube 104, the flow tube including inlet 105 and outlet 106, wherein the inlet 105 of flow tube 104 is connected to outlet 102 of hydrogen radical source 103, and wherein at least part of the cleaning device exposed to hydrogen radicals includes a material having a hydrogen radical surface recombination coefficient $\leq 0.02$.

According to yet another aspect of the invention, there is provided a device manufacturing method using an EUV lithographic apparatus, wherein after or during manufacturing the cleaning method of the invention is performed.

In an embodiment, hydrogen radical source 103 may be arranged outside the EUV lithographic apparatus.

According to another aspect of the invention, one or more non-reflective parts of the lithographic apparatus at least partially include a material having a hydrogen radical surface recombination coefficient $\leq 0.2$, more specifically $\leq 0.02$. In an embodiment, the material is selected from one or more materials from the group of KOH, KCl, quartz, PYREX®, $K_2CO_3$, W, $K_2SiO_3$, $Na_3PO_4$, Pd, Cu, TEFLON®, fused silica, Si, and $Si_3N_4$. For example, the back side of the reflectors, tubes, pipings, holders, gas barriers, intersection constructions, shutters, etc. may be coated or may include such a material. In an embodiment, there is provided a material with a recombination coefficient less than 0.01. In yet another embodiment, the recombination coefficient is less than 0.001. In yet another embodiment, the material is hydrogen radical resistant. In yet a further embodiment, a material is selected, wherein an etch rate of the material is less than ten times an etch rate of tin at a predetermined hydrogen radical partial pressure (i.e. under the same conditions of pressure, temperature, etc.). In another embodiment, the etch rate of the material is less than twenty times an etch rate of tin at a predetermined hydrogen radical partial pressure.

The appended figures may schematically depict a more than one embodiment. For example, referring to FIG. 3a, one may use one device 95, with one flow tube 104 with one opening 106, as seen at the left hand side of FIG. 3a, but one may also use a device with one or more flow tubes arranged in shadow areas 32.

The invention is not limited to EUV radiation alone, but may also be used for lithographic apparatus that use other radiation, as described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An EUV lithographic apparatus, comprising:
   an EUV radiation source;
   an optical element; and
   a cleaning device configured to provide a flow of hydrogen radicals, wherein the cleaning device comprises
   a hydrogen radical source; and
   a flow tube in communication with the hydrogen radical source, wherein the flow tube is arranged to provide the hydrogen radical flow at a predetermined position within the lithographic apparatus, and at least part of the cleaning device exposed to hydrogen radicals comprises a material having a hydrogen radical surface recombination coefficient $\leq 0.02$.

2. The EUV lithographic apparatus according to claim 1, wherein the recombination coefficient is less than 0.01.

3. The EUV lithographic apparatus according to claim 1, wherein the recombination coefficient is less than 0.001.

4. The EUV lithographic apparatus according to claim 1, wherein the material is hydrogen radical resistant.

5. The EUV lithographic apparatus according to claim 1, wherein an etch rate of the material is less than ten times an etch rate of tin at a predetermined hydrogen radical partial pressure.

6. The EUV lithographic apparatus according to claim 5, wherein an etch rate of the material is less than twenty times an etch rate of tin at a predetermined hydrogen radical partial pressure.

7. The EUV lithographic apparatus according to claim 1, wherein the optical element is selected from the group of multilayer mirrors, normal incidence mirrors, grazing incidence mirrors, collector mirrors, reticles, filters, apertures, masking blades, gratings and optical sensors.

8. The EUV lithographic apparatus according to claim 1, wherein the flow tube is arranged such that an outlet of the flow tube is provided within a distance of 50 cm from at least part of one or more surfaces of the optical element to be cleaned and wherein the flow tube is arranged such that at least part of the hydrogen radical flow is directed to at least part of a surface to be cleaned.

9. The EUV lithographic apparatus according to claim 8, wherein the distance is equal to or less than 20 cm from the surface of the optical element to be cleaned.

10. The EUV lithographic apparatus according to claim 8, wherein the distance is equal to or less than 10 cm from the surface of the optical element to be cleaned.

11. The EUV lithographic apparatus according to claim 1, wherein the lithographic apparatus comprises a plurality of cleaning devices.

12. The EUV lithographic apparatus according to claim 1, wherein the cleaning device comprises a plurality of flow tubes.

13. The EUV lithographic apparatus according to claim 1, wherein the flow tube comprises a plurality of outlets.

14. The EUV lithographic apparatus according to claim 1, wherein the flow tube comprises a plurality of branch tubes, each branch tube having an outlet, the branch tubes being arranged downstream with respect to the inlet of the flow tube.

15. The EUV lithographic apparatus according to claim 1, wherein the flow tube has a first cross section close to the inlet of the flow tube and a second cross section close to outlet of the flow tube and the quotient of the first and second cross section is $\leq 1$.

16. The EUV lithographic apparatus according to claim 1, wherein the optical element is a collector mirror and at least part of the flow tube is arranged within the collector mirror.

17. The EUV lithographic apparatus according to claim 1, wherein the optical element is a collector mirror and at least part of the flow tube is arranged in a shadow area of a reflector of the collector mirror.

18. The EUV lithographic apparatus according to claim 1, wherein the optical element is a collector mirror and at least part of the flow tube is arranged on at least part of the non-reflecting part of a reflector of the collector mirror.

19. The EUV lithographic apparatus according to claim 1, wherein the optical element is a collector mirror, the collector mirror comprising a plurality of reflectors, and the flow tube is arranged such that at least part of the hydrogen radical flow is directed to at least part of a space enclosed by two reflectors.

20. The EUV lithographic apparatus according to claim 1, wherein at least part of the flow tube is movable.

21. The EUV lithographic apparatus according to claim 1, wherein the hydrogen radical source comprises at least one hydrogen radical producing source selected from the group of an oscillating field electrode, a magnetron RF generator, and a hot filament.

22. The EUV lithographic apparatus according to claim 1, wherein a non-reflective part of the lithographic apparatus at least partially comprises a material having a hydrogen radical surface recombination coefficient $\leq 0.2$.

23. A method for cleaning an optical element of an EUV lithographic apparatus, the method comprising providing a cleaning device, the cleaning device comprising a hydrogen radical source; and a flow tube in communication with the hydrogen radical source, wherein the flow tube is arranged to provide the hydrogen radical flow at a predetermined position within the lithographic apparatus, and at least part of the cleaning device exposed to hydrogen radicals comprises a material having a hydrogen radical surface recombination coefficient $\leq 0.02$;
   providing a hydrogen flow to the cleaning device;
   generating a hydrogen radical flow; and
   providing the hydrogen radical flow at a predetermined position within the lithographic apparatus.

24. The method according to claim 23, wherein the cleaning method further comprises:
   providing a halogen gas at the predetermined position within the lithographic apparatus.

25. The method according to claim 23, wherein the hydrogen containing gas comprises at least one selected from the group of $H_2$, HD, $D_2$, HT, DT, and $T_2$.

26. A cleaning device configured to provide a flow of hydrogen radicals, the cleaning device comprising:
   a hydrogen radical source, and
   a flow tube in communication with the hydrogen radical source, wherein at least part of the cleaning device exposed to hydrogen radicals comprises a material having a hydrogen radical surface recombination coefficient $\leq 0.02$.

27. A method of manufacturing a cleaning device configured to provide a flow of hydrogen radicals, the method comprising:
   providing a hydrogen radical source and a flow tube in communication with the hydrogen radical source, wherein at least part of the cleaning device exposed to hydrogen radicals comprises a material having a hydrogen radical surface recombination coefficient $\leq 0.02$.

* * * * *